(12) United States Patent
Yoshihara

(10) Patent No.: US 7,673,196 B2
(45) Date of Patent: Mar. 2, 2010

(54) METHODS AND APPARATUS FOR COMMUNICATING WITH A TARGET CIRCUIT

(75) Inventor: Hiroshi Yoshihara, Round Rock, TX (US)

(73) Assignee: Sony Computer Entertainment Inc., Tokyo (JP)

(*) Notice: Subject to any disclaimer, the term of this patent is extended or adjusted under 35 U.S.C. 154(b) by 286 days.

(21) Appl. No.: 11/691,838

(22) Filed: Mar. 27, 2007

(65) Prior Publication Data

US 2008/0244341 A1    Oct. 2, 2008

(51) Int. Cl.
G01R 31/28    (2006.01)
(52) U.S. Cl. ...................................... 714/722
(58) Field of Classification Search ................ 714/722, 714/718, 719, 735, 736, 819, 724, 726, 738, 714/763, 799; 365/200, 201
See application file for complete search history.

(56) References Cited

U.S. PATENT DOCUMENTS 7,058,865 B2 *    6/2006    Mori et al. ................... 714/724
2008/0304343 A1 *    12/2008    Yoshihara ................... 365/201

* cited by examiner

Primary Examiner—Phung M Chung
(74) Attorney, Agent, or Firm—Matthew B. Dernier, Esq.; Gibson & Dernier LLP

(57) ABSTRACT

A system and method are disclosed which may include establishing a stored test vector, including a plurality of data bits, within a vector data engine; transmitting the stored test vector to a memory array; performing at least one arithmetic or logical operation upon the stored test vector by a vector data generator within the vector data engine to update the stored test vector; and repeating the steps of transmitting and performing so as to continuously transmit continuously changing stored test vectors to the memory array.

34 Claims, 10 Drawing Sheets

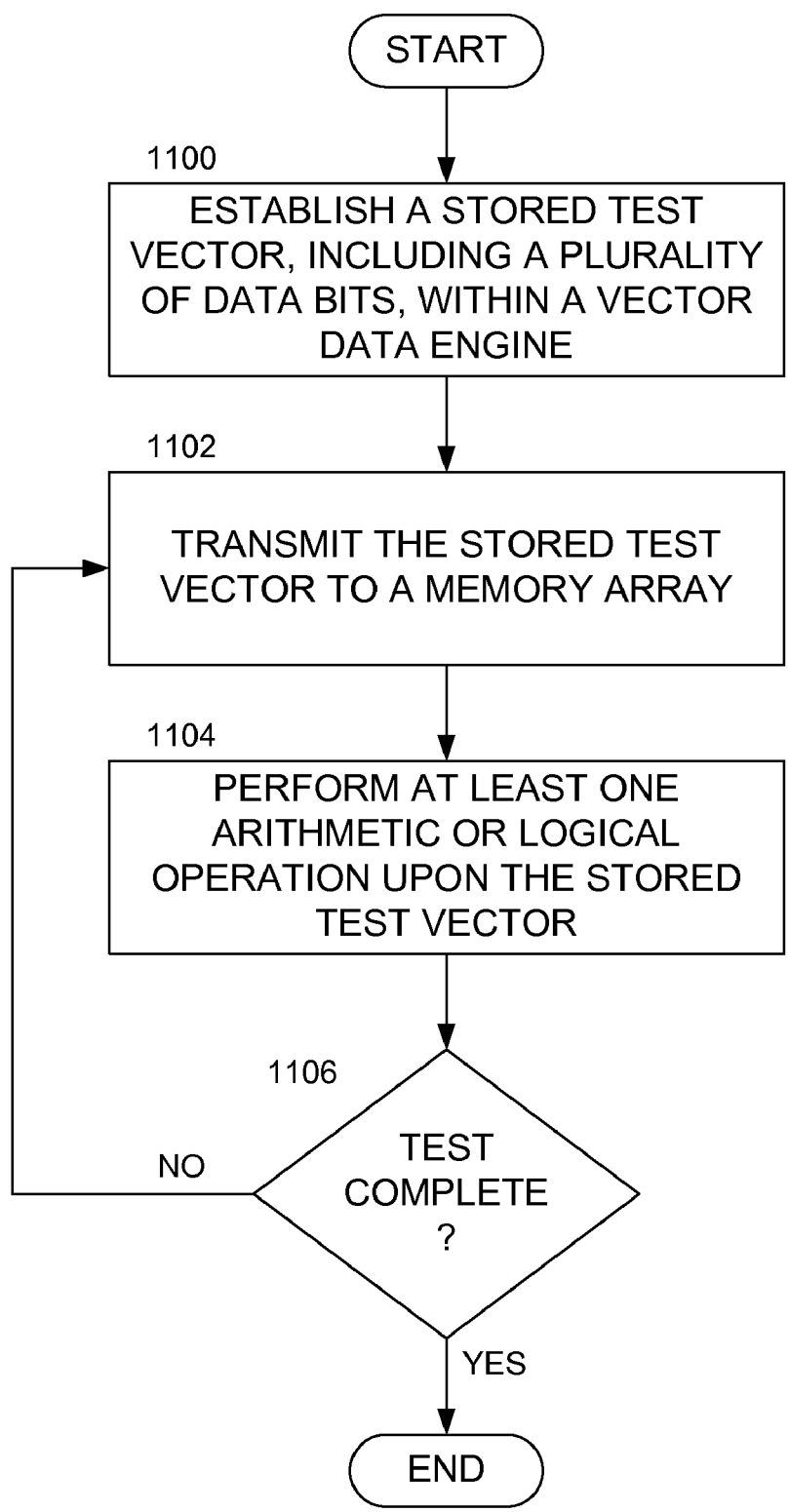

METHODS AND APPARATUS FOR COMMUNICATING WITH A TARGET CIRCUIT

BACKGROUND OF THE INVENTION

The present invention relates to systems and methods for AC testing of a memory array.

In general, testing a target circuit, such as an integrated circuit (IC), prior to packaging may reveal problems associated with the individual ICs and also with the IC fabrication process preceding the packaging step. Testing an IC after packaging may reveal problems arising from the packaging process steps, such as die attachment, wire bonding, among other steps.

So-called scan chain testing techniques may be employed for testing IC circuits before and/or after packaging. Existing scan chain test operations for DC testing include scanning a known sequence of bits into a series of respective latches (flip flops) within the IC circuit. The latches are selected to direct the scanned bits to the input(s) of the target circuit, such as combinational logic, Static Random Access Memory (SRAM), etc. The target circuit is provided with a significant amount of time to let the input sequence of bits settle at the input(s) and outputs of the gates, memory cells, etc., such that test output bits are produced in response to the input bits. In other words, no dynamic testing is conducted. The output bits are directed to a selected series of output latches of the IC. Commands are then issued to scan the test output bits from the output latches, and the output bits are compared to a known template to determine whether the target circuit is operational.

Notably, the input latches and output latches are typically already part of the IC and, under normal operating modes, perform functions that permit the IC to operate. The testing designer, however, selects the input and output latches from among the latches of the IC to be used in the scan chain testing process. Selector circuits may be employed to switch the input/output connections of the selected latches between normal operating modes and the scan chain testing mode. Since the DC scan chain testing process does not perform dynamic (AC) testing, virtually any of the existing latches of the IC may be selected as input/output latches for the scan chain test process no matter where (how far) they may be located relative to the inputs/output of the target circuit, the impedances of the interconnections, or potential sources of electromagnetic interference.

Existing systems for AC testing may also involve selecting input and output latches from among existing latches of the IC to be used in an AC testing process. However, since a dynamic test is desired, the input bits to the target circuit must be rapidly provided in order to exercise the target circuit in ways that may uncover defects, such as input/output set up times, propagation delays, impedance characteristics, electromagnetic interference sources, etc. Thus, AC testing techniques typically use a CPU (Central Processing Unit) external to the target circuit to drive data into and out of selected input/output latches adjacent to the target circuit. Generally, the CPU is coupled to respective input and output connections for a portion of a circuit being tested which are generally within a limited, localized region of the test circuit. However, it is cumbersome and complex to connect an external CPU in this manner to all portions of a circuit for which testing is sought.

A special case of circuit testing is that of Array Built In Self Test (ABIST). An ABIST circuit can include an ABIST engine, an array macro, which in turn includes a memory array, and communication links between the ABIST engine and the array macro.

Herein, an array macro may correspond to a circuit that includes a memory array (which may also be referred to as a "memory core") and additional functionality to enable communication between the memory core and devices external to the array macro.

For DC testing, the ABIST engine generates "write data" (for storage in the array) and address values and sends both to scannable latches in the array macro. Thereafter, the storage data are stored in the specified addresses in a memory array within the array macro. The ABIST engine then issues a read instruction to the array macro, retrieves output data from the array macro, and compares the retrieved data to expectation data generated by the ABIST engine. The functionality of the array macro is then determined by comparing the expectation data (which generally corresponds to the original write data) with the data retrieved from the array macro.

While the above process is effective for DC testing an array macro, the speed at which data can be provided to the memory array is limited by the rate at which the write data and address values can be transmitted from the ABIST engine to the scannable latches of the array macro. A few cycles of continuous data transmission to the memory array may be obtained by using multiple sets of (such as two or three) input latches for inputting data to a single set of memory array input lines. However, it is cumbersome to add hardware to the array macro in this manner. Moreover, sending only two or three sets of input "write data" in rapid succession, for AC testing purposes, does not sufficiently exercise the various features of the array macro for circuit evaluation purposes.

Accordingly, it would be desirable to be able to rapidly conduct a large number of continuous data writing operations to the memory array to conduct proper AC testing thereof.

SUMMARY OF THE INVENTION

In accordance with one aspect, the invention is directed to a method that may include establishing a stored test vector, including a plurality of data bits, within a vector data engine; transmitting the stored test vector to a memory array; performing at least one arithmetic or logical operation upon the stored test vector by a vector data generator within the vector data engine to update the stored test vector; and repeating the steps of transmitting and performing so as to continuously transmit continuously changing stored test vectors to the memory array.

In accordance with another aspect, the invention is directed to an apparatus for providing data to memory array that may include a vector data engine having a data storage device and a vector data generator, the vector data engine operable to: establish a stored test vector, including a plurality of data bits, within the data storage device; transmit the stored test vector to the memory array; perform at least one arithmetic or logical operation upon the stored test vector by the vector data generator to update the stored test vector; and continue to transmit and update the stored test vector.

In accordance with yet another aspect, the invention is directed to an apparatus, that may include a memory array; a decoder circuit having a plurality of output pins in communication with the memory array, wherein one and only one of the output pins has an active memory access signal thereon at a time; and a shift counter in communication with the output pins and operable to shift the active signal between successive ones of the output pins.

Other aspects, features, advantages, etc. will become apparent to one skilled in the art when the description of the preferred embodiments of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIG. 10 is a flow diagram illustrating process steps that may be carried out in accordance with one or more of the embodiments disclosed and/or discussed herein.

DETAILED DESCRIPTION OF THE PREFERRED EMBODIMENTS

Herein, the term "DC testing" generally corresponds to circuit testing which tests the steady state response of a target circuit, or simply "target." The target may be initially in a stable condition, then receive test input data, and then generate test output data, based on logical operations and/or on memory location accesses, by the target. In DC testing, the target is generally permitted to reach a steady-state condition and to then allow test output data to be extracted therefrom. The target circuit is provided with a significant amount of time to let the input sequence of bits settle at the input(s) and outputs of the gates, memory cells, etc., such that test output bits are produced in response to the input bits. In other words, no dynamic testing is conducted.

Herein, the term "AC testing" generally corresponds to circuit testing in which the dynamic response of a target is tested. The target may initially be in a stable condition. Thereafter, one or more streams of data bits may be transmitted to the target at a relatively rapid rate, generally corresponding to the conditions the target would experience during normal operation thereof within an integrated circuit. In AC testing, the target is generally not given extra time to guarantee that all regions of the target stabilize before sending additional data and/or scanning output data from the target. Indeed, as a dynamic test is desired, the input bits to the target circuit must be rapidly provided in order to exercise the target circuit in ways that may uncover defects, such as input/output set up times, propagation delays, impedance characteristics, electromagnetic interference sources, etc. In this manner, the real-time, dynamic characteristics of the target, such as race conditions, etc., among other characteristics, may be evaluated when employing AC testing techniques.

Figure 1:
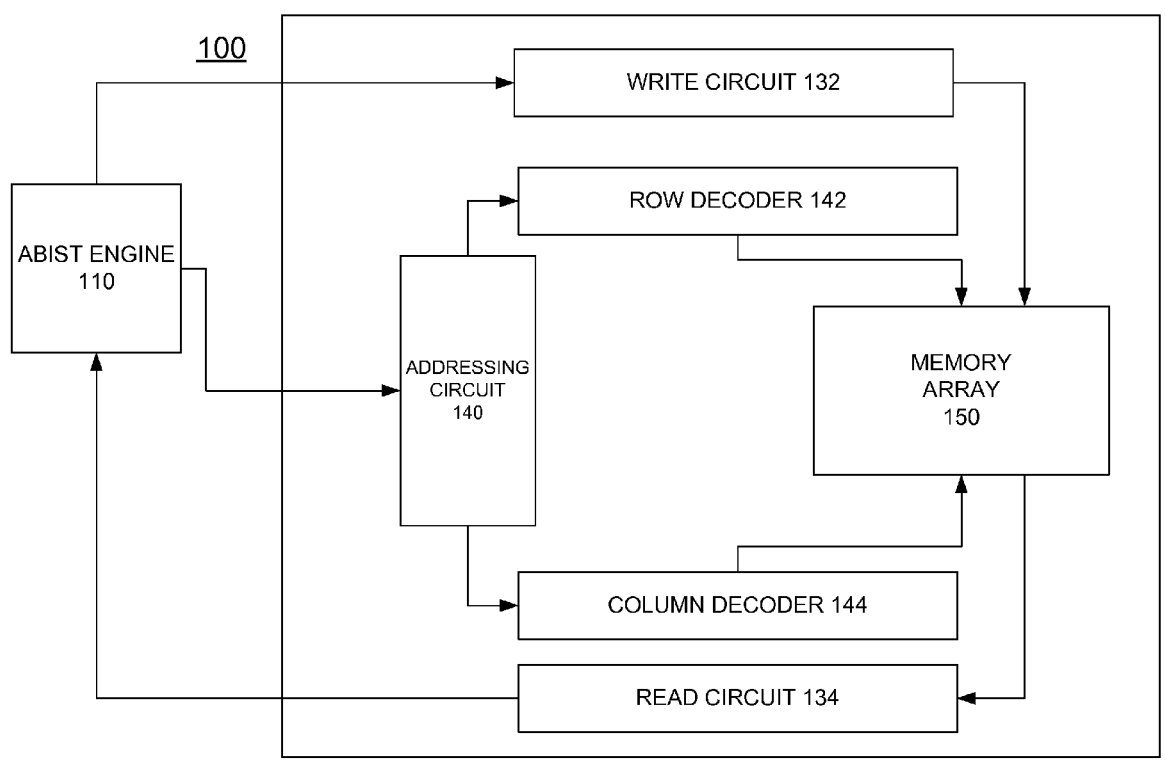
FIG. 1 is block diagram of an array macro in communication with an ABIST engine that is adaptable for use with one or more embodiments of the present invention.

FIG. 1 is block diagram of a circuit 100, including an array macro 120, in communication with an ABIST engine 110, that is operable for use with one or more embodiments of the present invention. Array macro 120 may include write circuit 132, read circuit 134, addressing circuit 140, row decoder 142, column decoder 142, and memory array 150.

In one or more embodiments, circuit 100 may write data to memory array 150, read data out of memory array 150, and compare the read data to expected values for the read data and establish a pass or fail condition for the test. In one or more embodiments, ABIST engine 110 may be a general or special purpose processor that may be operable to generate vector data ("write data") and/or address vectors (address values) for writing and/or reading data to/from array macro 120. ABIST engine 120 may also be operable to transmit one or more control signals to array macro 120 for controlling writing data thereto, reading data therefrom, and/or testing data therein.

In one or more embodiments, write circuit 132 may include one or more scannable latches and may be operable to receive data from ABIST engine 110 and re-transmit this data to memory array 150. In one or more embodiments, write circuit 132 may be commanded to write given data to memory array 150 without receiving the given data from ABIST engine 110. In such embodiments, the data may result from a "preset condition" activated by suitable control signal(s). Alternatively, the given data may be generated by write circuit 132. In one or more embodiments, read circuit 134 may also include one or more scannable latches and may be operable to receive data from memory array 150 and re-transmit this data to ABIST engine 110.

In one or more embodiments, addressing circuit 140 may receive address data from ABIST engine 110. Addressing circuit 140 may also generate address data, as is discussed in greater detail later in this disclosure. Addressing circuit 140, may, upon receiving suitable control signal(s) from ABIST engine 110, or other device(s), transmit address data to row decoder (row decoder circuit) 142 and/or column decoder (column decoder circuit) 144, to either write data to, or read data from, memory array 150. Memory array 150 may include a grid of memory cells that are organized into rows and columns as is well known in the art.

In one or more embodiments, row decoder 142 and/or column decoder 144 may communicate with memory array 150 to identify a single memory cell, a plurality of memory cells, an entire row of cells, a plurality of rows of memory cells, an entire column of cells, and/or a plurality of columns of memory cells within memory array 150.

As discussed above, circuit 100 may write data to memory array 150, read data out of memory array 150, and compare the read data to expected values for the read data and 1 establish a pass or fail condition for the test. More specifically, ABIST engine 110 may direct write data to write circuit 132 and address data to addressing circuit 140 and may cause write circuit 132, addressing circuit 140 and one or both of row decoder 142 and column decoder 144 to cause the write data to be stored at the address within memory array 150 indicated by the address data received at addressing circuit 140. This process may be repeated as many times as desired, thereby placing a plurality of sets of write data bits in a plurality of respective memory locations in memory array 150.

Either during or after the above-described writing of data to memory array 150, ABIST engine 110 may send address data to addressing circuit 140, accompanied by a suitable read control signal, to cause memory array 150 to transmit output data from memory array 150 to read circuit 134. Thereafter, the output data may be transmitted to ABIST engine 110 for comparison with expectation data. If the output data matches the expectation data, then the memory array 150 passes the test. If the output data does not match the expectation data, then memory array 150 fails the test.

In some embodiments, addressing circuit 140, write circuit 132, and read circuit 134 may each include a plurality of latches that are connected in series to form data-latch scan chains. Thus, in such embodiments, data from ABIST engine 110 is scanned in serially to the above-listed devices. Notably, such communication may require one clock pulse for every bit of data to be scanned into either of circuits 132 and 140 and to be scanned out of read circuit 134.

Data transmission within array macro 120 may occur more rapidly, using parallel connections between devices in communication with one another, which may require only a single clock cycle to transmit a plurality of data bits. Thus, the scanning of write data and address data that originates from ABIST engine 110 into write circuit 132 and addressing circuit 140, respectively, may impose an upper limit on the operating frequency of the above-described testing process for memory array 150. This upper limit may operate to impede AC testing of memory array 150, that is, conducting testing at a sufficiently high frequency to test the dynamic response of the various circuits within memory array 150.

Accordingly, one or more embodiments of the present invention are directed to improving the frequency at which such testing may be conducted. Specifically, one or more embodiments of the present invention are directed to enabling addressing circuit 140 to generate updated address data at a sufficiently high frequency to improve AC testing of memory array 150. Moreover, in one or more alternative embodiments, the principles disclosed herein may also be applied to generating continuously changing write data, by write circuit 132, at the same rate at which address data is changed. It is noted, that, for the purposes of one or more embodiments disclosed herein, write data may, but need not, be altered in each consecutive write operation. In such embodiments, it may be sufficient to issue a suitable write command that is synchronized with the updating of the address data.

Figure 2:
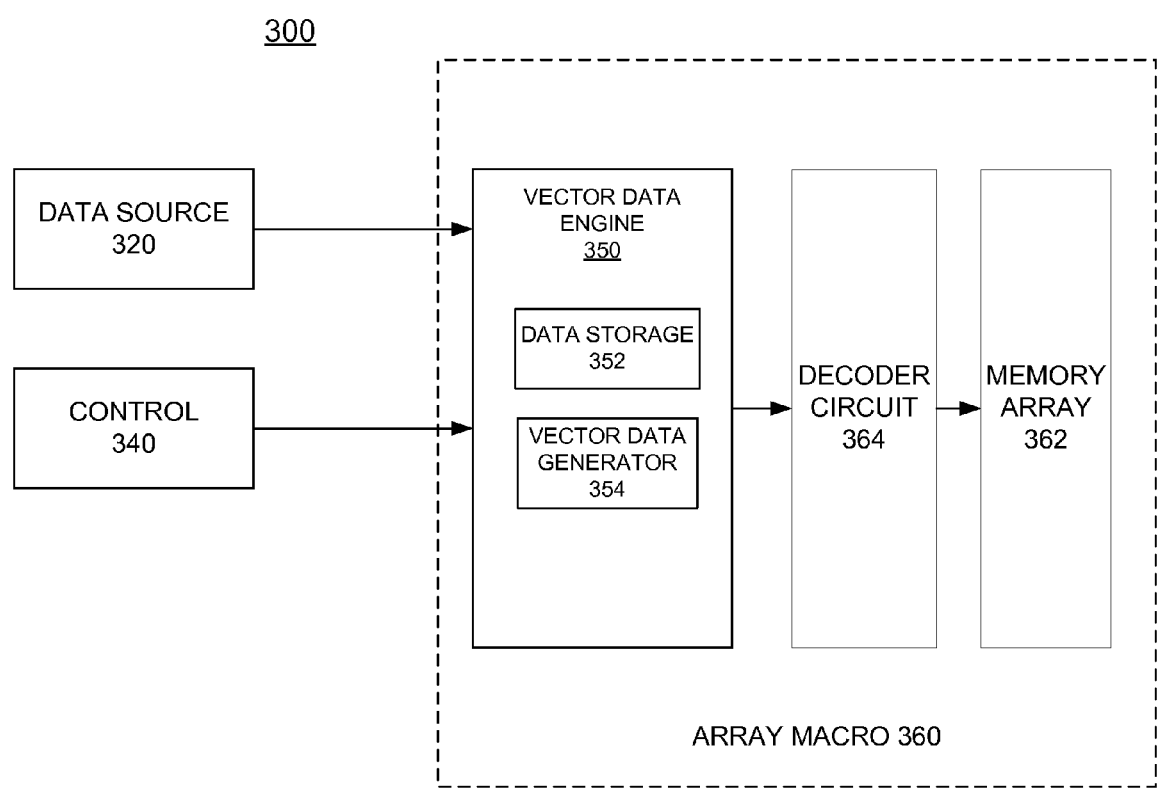
FIG. 2 is a block diagram of a circuit for providing vector data to a memory array in accordance with one or more embodiments of the present invention.

FIG. 2 is a block diagram of a circuit 300 for providing vector data to memory array 362 in accordance with one or more embodiments of the present invention. Circuit 300 may include data source 320, control circuitry 340, and at least a portion of array macro 360. The portion of array macro 360 shown in FIG. 2 is a portion of one embodiment of array macro 120 shown in FIG. 1. In particular, one or more embodiments of vector data engine 350 may be substituted for addressing circuit 140 and/or write circuit 132 of array macro 120. Also, the functions of data source 320 and control 340 may be provided by ABIST engine 110, one or more general purpose processors, and/or other processing devices. Array macro 360 may include one or more vector data engines 350, one or more decoder circuits 364, and one or more memory arrays 362.

In one or more embodiments, circuit 300 may provide a system and method in which various steps of a testing process may be conducted within array macro 360 to achieve greater operating frequency and greater independence of the testing process from ABIST engine 110 or other device external to array macro 360. In the following, a general description of the operation of array macro 360 is provided.

Data source 320 may be any device capable of supplying data, such as write data and/or address data, to vector data engine 350. Control circuitry 340 may be any device capable of transmitting suitable control signals to array macro 360, which may include selector control signals to control data flow paths for circuit 300. Components of circuit 300 which may have a general purpose use during normal circuit 300 operation, but the selector control signals may alter data flow paths for the purpose of testing array macro 360. Control circuitry 340 may be further able to provide clock signals, read control signals, write control signals, vector data generation control signals, test enable signals, and/or signals to count test cycles and/or other activities within array macro 360. The clock signals that may be provided by control circuitry 340 may include data transmission clock signals, vector data calculation clock signals, among others.

Vector data engine 350 may include data storage device 352 and vector data generator 354. In one or more embodiments, upon receiving initial vector data from data source 320, vector data engine 350 may generate continuously changing vector data and transmit this vector data to memory array 362, without requiring further vector data transmission from data source 320. In this manner, the operation of vector data engine 350 may remove the need to engage in relatively slow communication from data source 320 to acquire each successive vector data value, thereby enabling much more rapid provision of successive vector data values within vector data engine 350, and correspondingly rapid transmission of these successive vector data values to memory array 362.

Data storage device 352 may serve as temporary storage for a test vector suitable for transmission to decoder circuit 364 and/or directly to memory array 362. Additionally or alternatively, data storage device 352 may also be suitable for providing permanent data storage. In one or more embodiments, data storage device 352 may include a plurality of data latches (flip-flop circuits) and/or other data storage circuitry.

Vector data generator 354 may be any circuit capable of modifying a test vector, which test vector may be stored in data storage device 352. Vector data generator 354 may include circuitry for performing one or more arithmetic operations and/or one or more logical operations on vector data stored in data storage device 352 and/or on other data. For instance, vector data generator may include one or more adder circuits, one or more of which may be half-adder circuits. Herein, the term "test vector" generally corresponds to the term "vector data". A test vector may include a data vector and/or an address vector.

In one or more embodiments, the function of data storage device 352 and vector data generator 354 may be provided by two or more separate digital logic devices. Alternatively, the two above-listed functions may be performed within a single digital logic device or circuit. In still other embodiments, the two functions may both be performed by a plurality of circuits, with each such circuit providing a portion of the functionality of each of data storage device 352 and vector data generator 354.

Decoder circuit 364 may receive vector data from vector data engine 350 and retransmit this vector data in a form adapted for reception by memory array 362.

Memory array 362 may receive decoded vector data from decoder circuit 362. Alternatively, memory array 362 may receive vector data, such as write data, directly from vector data engine 350.

In one or more embodiments, data from data source 320 may be communicated to vector data engine 350 and stored, or provided, in data storage device 352, thereby providing an initial stored test vector therein. In one or more embodiments in which data source 320 is located outside array macro 360, the transmission of an initial test vector, or other data, from data source 320 to vector data engine 350 may employ communication along a set of data latches that are connected in series under the control of control circuit 340. Consequently, such communication may be relatively slow in comparison with data communication occurring between devices that are both located within array macro 360.

In one or more alternative embodiments, the initial test vector may be generated via the transmission of a reset control signal from control circuitry 340 to vector data engine 350. Such a signal may operate to store a value such as "0000" or other default value in data storage device 352.

The stored test vector may then be transmitted to memory array 362, which may be a memory array. In one or more embodiments in which the test vector is an address vector, the address vector may first be transmitted to decoder circuit 364. Decoder circuit 364 may decode the test vector and communicate the result to memory array 362.

In one or more alternative embodiments in which the stored test vector is a data vector, the data vector may be communicated directly to memory array 362 and stored therein. The location in memory array 362 at which the data vector may be stored, may be specified by another device in communication with memory array 362, such as another decoder circuit.

In one or more embodiments, the test vector in data storage device 352 may be operated upon and modified by vector data generator 354. The one or more operations, also referred to herein as "vector data calculations", conducted by vector data generator 354 on the test vector may be conducted in hardware to achieve optimal processing speed. The operations, or vector data calculations, may include incrementing by a value of one or more, decrementing by one or more, multiplying by a known quantity, dividing by a known quantity, among other operations. The above-listed operations may include one or more arithmetic operations, and/or one or more logical operations.

In one or more embodiments, the result of one or more calculations performed upon a test vector by vector data generator 354 may be stored in data storage device 352, thereby providing an updated test vector therein.

In one or more embodiments, the steps of modifying the test vector, storing the result of the modification in data storage device 352 as an updated test vector, and transmitting the updated test vector to memory array 362 (either directly or via decoder circuit 364) may be repeated in rapid succession to thereby continuously transmit continuously changing test vector values to memory array 362. Moreover, the listed steps may be automatically repeated, which may correspond to repeating the listed steps upon the receipt of a clock pulse.

In one or more embodiments, circuit 300 of FIG. 2 may enable the modification and transmission of test vectors to memory array 362 far more rapidly than is possible when separately acquiring each test vector from a data source external to array macro 360 such as data source 102, which could be part of ABIST engine 110 (FIG. 1).

In one or more embodiments, vector data generator 354 may conduct a calculation using a preceding test vector value as an input, providing an updated test vector as an output, and storing the result in data storage device 354 within one, or a few, clock cycles. In contrast, where data storage device 352 is a data-latch scan chain, one clock cycle may be needed for each bit of a test vector transmitted from data source 320 to vector data engine 350 for storage in data storage device 352. Where it is desired to transmit a succession of different 64, -bit test vectors to memory array 362, it may be seen the embodiment of FIG. 2 may operate to transmit vector data to memory array 362 at a much higher frequency than will any existing embodiment that must retrieve each 64 bit test vector along a serial link from data source 320.

Figure 3:
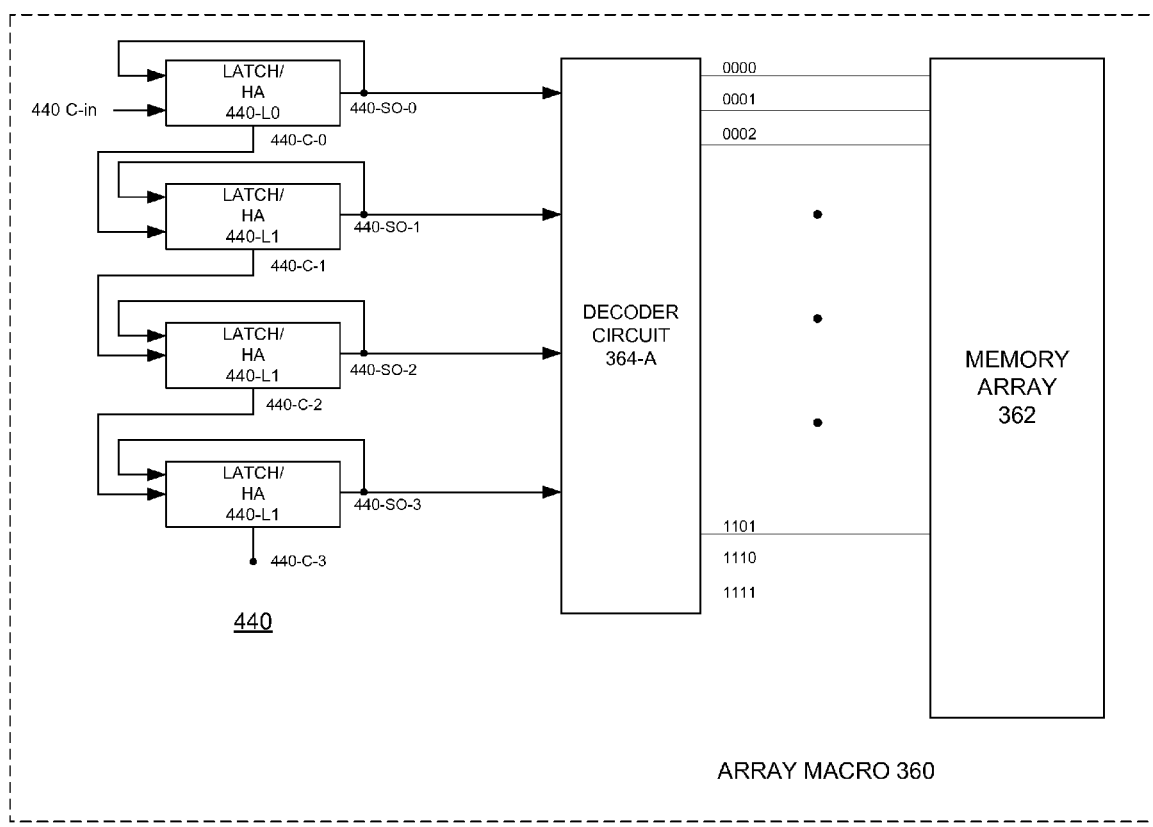
FIG. 3 is a block diagram of a circuit for providing address vectors to a memory array in accordance with one or more embodiments of the present invention.

FIG. 3 is a block diagram of a circuit 400 for providing address vectors to a memory array 362 in accordance with one or more embodiments of the present invention. Circuit 400 is one embodiment of the portion of array macro 360 shown in FIG. 2. Moreover, scan chain 440 is one embodiment of vector data engine 350 of FIG. 2.

Circuit 400 may include a portion of array macro 360 which may in turn include data-latch scan chain 440, decoder circuit 364-A and memory array 362. Circuit 400 may be operable to provide an automatically incrementing set of address values from scan chain 440 to memory array 362 to enable rapidly accessing an infinite sequence of storage locations within memory array 362.

In one or more embodiments, a binary word formed by the outputs of the latches of scan chain 440 may be incremented by a value of 1 for each clock cycle of scan chain 440. In one or more embodiments, one clock pulse may be employed to trigger the incrementing function, and another clock pulse may be employed for the normal operation of each of the latches. In one or more other embodiments, the binary word output of scan chain 440 may be incremented by values greater than one for each clock pulse.

In one or more alternative embodiments, one or more arithmetic and/or logical operations in place of or in addition to the above-described incrementing function may be implemented. Such operations may include but are not limited to decrementing by values of one or more, multiplying or dividing the binary word output of scan chain 440 by a specified value, among other arithmetic and/or logical operations.

Data-latch scan chain 440 may include a plurality of data latches 440-L0 to 440-L3 and suitable connections disposed between the latches. While four latches are shown within data-latch scan chain 440, fewer or more than four latches may be deployed within scan chain 440. In one or more embodiments, the connections between latches 440-L0 to 440L3 that form scan chain 440 may be permanently hard-wired into scan chain 440. However, in one or more alternative embodiments, the test mode wiring connections between the latches may be selectively implemented during a test mode of the latches of scan chain 440 and selectively removed during a normal mode function thereof. A combination of control circuitry and selectors may be suitably deployed to implement the above-described wiring connections for latches 440-L0 to 440-L3.

In the following, the reference numeral "440-L" refers to any one of the four latches shown in data-latch scan chain 440. In one or more embodiments, data latch 440-L may include circuitry corresponding to a conventional flip-flop circuit and at least one circuit for performing an arithmetic operation and/or logical operation on the contents of that latch and/or on data drawn from latch 440-L and one or more other sources.

In one or more embodiments including that shown in FIG. 3, latch 440-L may include a conventional flip-flop circuit and an adder circuit, which may be a half-adder circuit, in communication therewith. In one or more embodiments, the adder circuit may be incorporated within latch 440-L.

The half-adder circuit may receive two inputs and provide two outputs: a "sum" bit and a "carry" bit. In such embodiments, the sum output may serve as the output for that latch and may also serve as one of the inputs for that latches half-adder circuit. The carry output of each latch may serve as an input to an adjacent latch, which may be one bit higher in a bit-order rank of the latches within scan chain 440. In this embodiment, the "carry" input to latch-L0 (for which there is no lower bit order latch to provide a "carry" output), labeled "440 C-in," may be kept high at all times.

In other alternative embodiments, apparatus for performing the arithmetic operation need not be incorporated within each latch 440-L. Instead, arithmetic and/or logical operation circuitry may be in communication with, but deployed separately from, latches 440-L0 through 440-L3.

Decoder circuit 364-A may operate to decode address vectors (address values) in which a binary word received at an input to decoder circuit 364-A may be decoded so as to activate a selected output pin among a plurality of output pins extending from decoder circuit 364-A. The structure of decoder circuit 362-A is known in the art and is therefore not described in detail herein. The function of decoder circuit 364-A within circuit 400 is described below. Memory array 362 may be grid of memory cells suitable for storing binary data as is well known in the art.

In one or more embodiments, an initial address value may be scanned into scan chain 440 from a device external to array macro 360, such as data source 320 (FIG. 2) which may be an ABIST engine or other data source. A control signal may then be applied to the latches of scan chain 440 to initiate a test of memory array 362. The control signal may be provided by ABIST engine 110 (FIG. 1) or other suitable control circuitry.

For the sake of illustration, the following discussion is directed to an embodiment in which the address values in scan chain 440 are incremented to provide a series of data writing operations to memory array 362.

The following discussion is directed to the coordination of a memory address designation signal with a write control signal. It may be readily seen by those of skill in the art that the memory address designation provided by scan chain 440 to decoder 364-A and then transmitted to memory array 362 in decoded form may be coordinated with a "read control signal" in a manner analogous to the above-described coordination between a write control signal and the memory location designation corresponding thereto. Accordingly, a detailed discussion of a "read" operation is not provided in this section.

In one or more embodiments, an initial address value (address vector) may be transmitted to decoder circuit 364-A, which may in turn, activate an output pin, the number of which may correspond to the address value transmitted from scan chain 440. The activated output pin may then designate a destination within memory array 362 to which write data may be transmitted. ABIST engine 110 or other suitable control circuitry may then transmit a "write" control signal to trigger the transmission of write data to the designated location within memory array 362. Suitable synchronization of the write control signal with the memory location activation signal may be provided ABIST engine 110 or other suitable control circuitry.

In one or more embodiments, upon receiving suitable clock signal input, the incrementing function of scan chain 440 may be activated, and the result of the incrementing operation may be latched at the outputs of the latches of scan chain 440. This latched output is effectively an updated address vector, or address value, that is "stored" in latches 440-L through 440-L3.

In one or more embodiments, the above-described processes of incrementing, storing, and transmitting address vectors may be repeated until the initial address value stored, or latched, at the latch outputs of scan chain 440 has been incremented to a maximum storable value, such as "1111" (in the simplified case of a four-bit output), or to some other selected binary-word output value. Alternatively, other conditions may be employed to bring the above process to halt, including but not limited to: a control signal indicative of test conclusion, a fault condition, and/or one or more other termination conditions.

To illustrate the operation of one or more embodiments of the present invention, an example is considered below in which "write data" is written to a plurality of memory array 362 addresses indicated by successive outputs from scan chain 440. The example begins with the address vector "0000" being scanned into scan chain 440. While not shown in FIG. 3, a write circuit, such as write circuit 132 of FIG. 1, may have an initial data vector provided thereto. The write circuit may also be a data-latch scan chain, but alternatively may be any type of circuit suitable for rapidly writing a data vector to a designated location within memory array 362. As discussed above, the write circuit may also have circuitry incorporated therein, or which is in communication therewith, that may perform logical and/or arithmetic operations on a data vector stored therein to continuously modify the data vector with each successive clock cycle.

For the sake of this example, the initial data vector value is set to "0000". Thus, upon receiving a suitable clock signal, the data vector "0000" will be written to memory location "0000" of memory array 362. Continuing with the example, as described above, the address vector may increment to "10001". The data vector in write circuit 132 may remain the same, or alternatively may be modified using an incrementing circuit, as described above, or other logical or arithmetic operation circuit. Assuming that the data vector remains unchanged, the data vector "0000" may be written to memory array 362 locations 0000 through 1111.

While the above example is directed to four-bit data vectors at address locations defined by four-bit address vectors, it will be appreciated that the concepts illustrated in the example are applicable to data vectors of any size and address vectors of any size. Moreover, while the above example incorporates a continuously changing data vector, the present invention may be practiced without so modifying the data vector. In this case, and repeating a portion of the conditions of the above example, the same data vector may be written to memory locations "0000" through "1111". This constant data vector, however, could have any value between "0000" and "1111", when operating within the stated constraint of data vectors being four bits long.

Notably, one or more embodiments including that shown in FIG. 3, are able to rapidly generate and transmit address data that may change with each succeeding clock cycle, thereby enabling an entirety or a selected portion of memory array 362 to be filled with data vectors (write data), without resorting to the process of scanning in a new address vector for each write operation to memory array 362, which scanning process is vastly more time consuming than the address vector generation described in connection with FIG. 3. FIG. 3 is directed to the use of four-bit address vectors, in which the time savings of the embodiment of FIG. 3 over existing systems that scan new addresses in for each write operation is significant. However, It may be seen that such time savings increase dramatically where the address vectors are 128 bits long or still longer.

Figure 4:
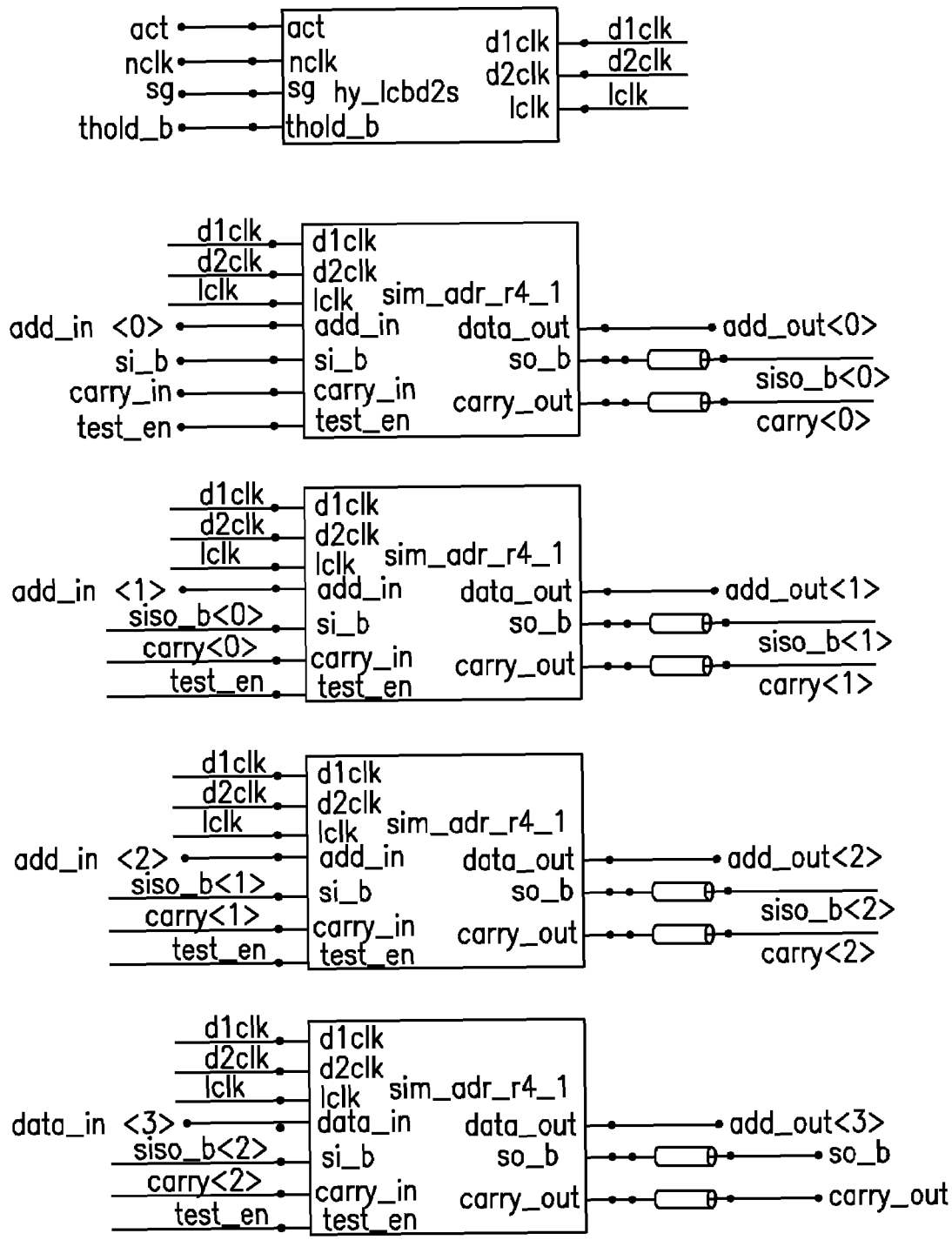
FIG. 4 is schematic diagram of a circuit suitable for implementing one portion of the circuit of FIG. 3, in accordance with one or more embodiments of the present invention.

FIG. 4 is schematic diagram of a circuit 500 suitable for implementing one embodiment of the scan chain 440 discussed in connection with FIG. 3, in accordance with one or more embodiments of the present invention.

Figure 5:
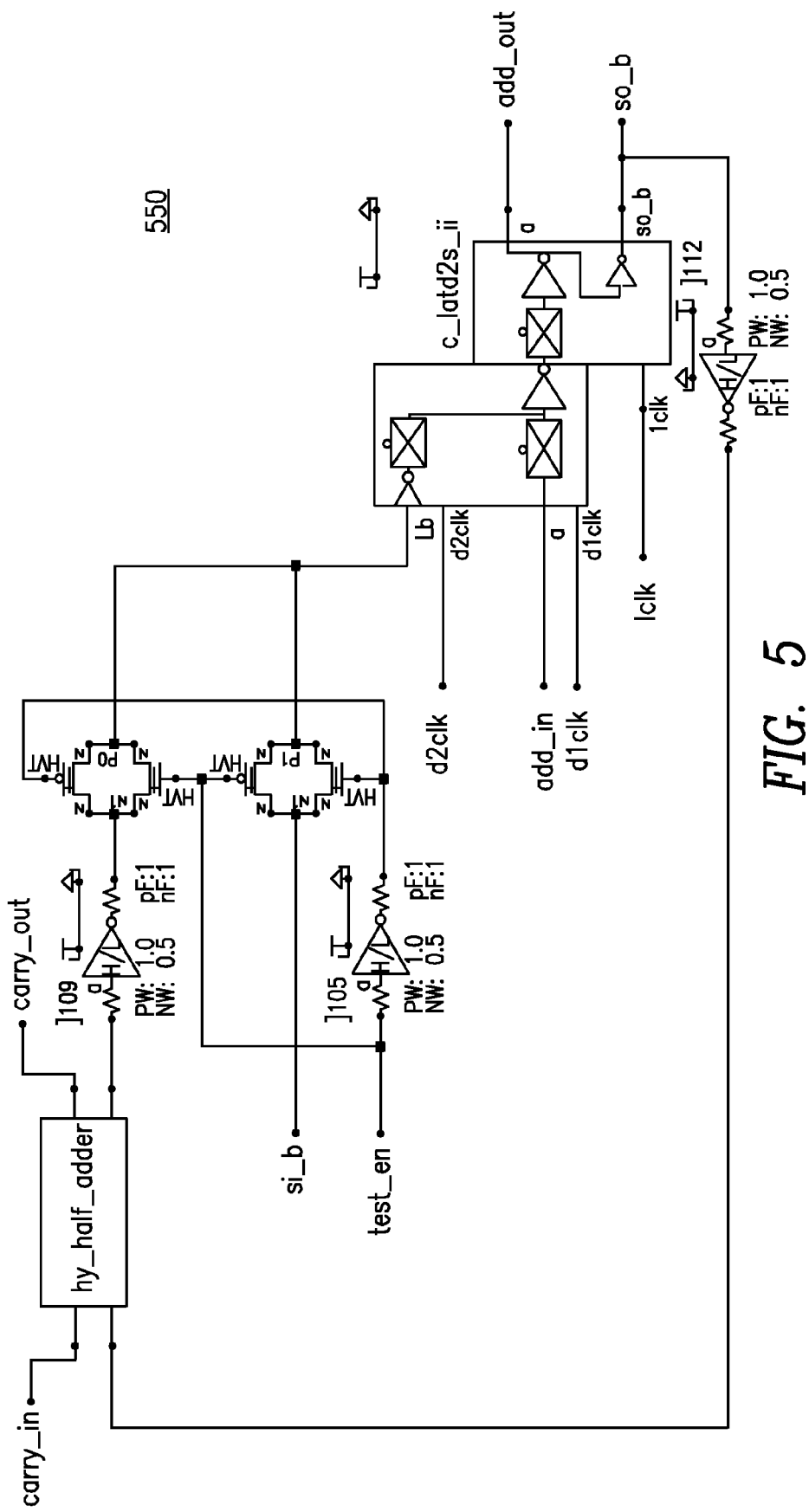
FIG. 5 is a schematic diagram of a circuit suitable for implementing one portion of the circuit of FIG. 3, in accordance with one or more embodiments of the present invention.

FIG. 5 is a schematic diagram of a circuit 550 suitable for implementing one data latch of the scan chain 440 discussed in connection with FIG. 3, in accordance with one or more embodiments of the present invention.

Figure 6:
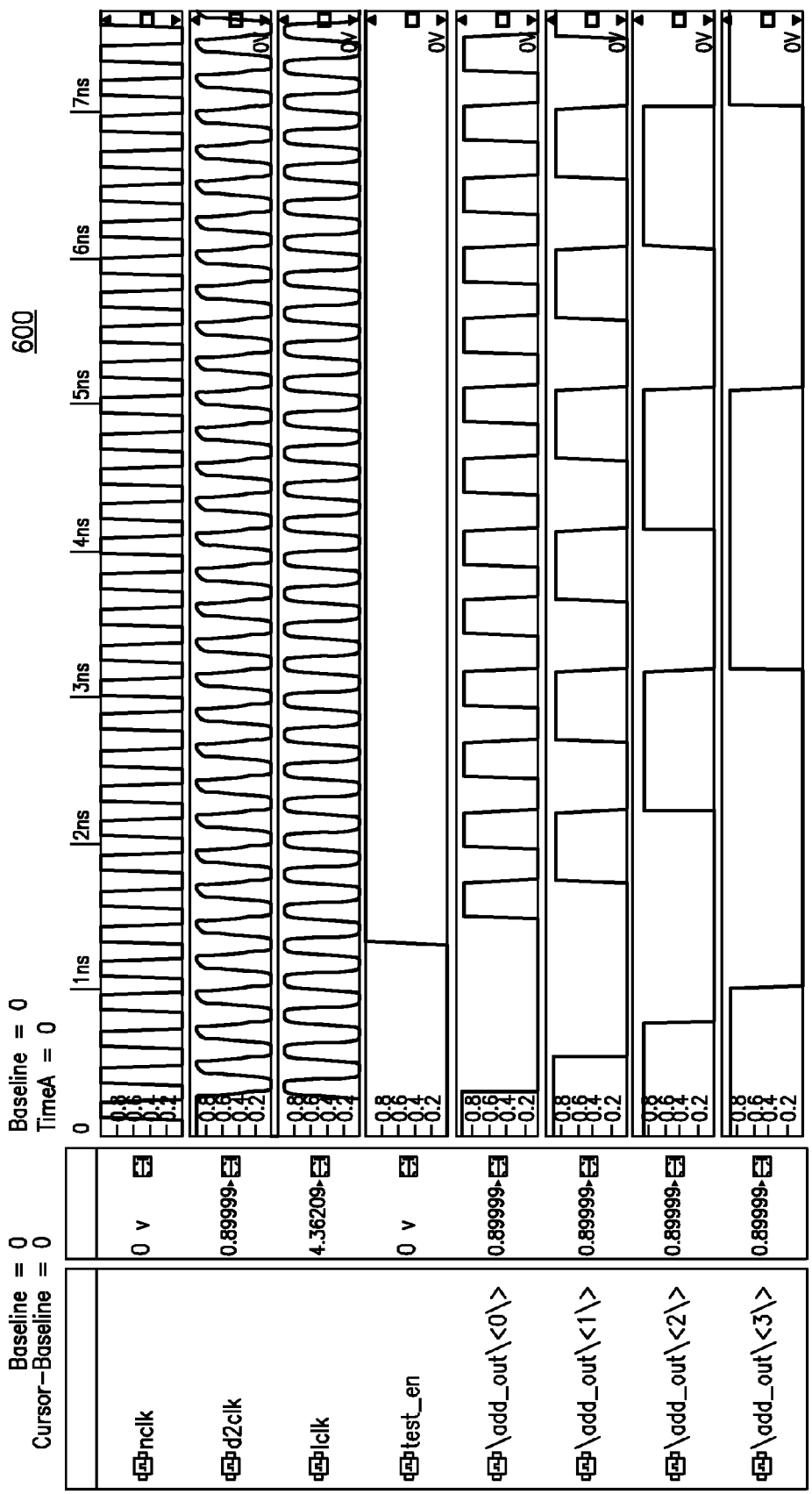
FIG. 6 is a timing chart showing the interaction of various signals associated with the operation of the circuits of FIGS. 4 and 5, in accordance with one or more embodiments of the present invention.

FIG. 6 is a timing 600 chart showing the interaction of various signals associated with the operation of the circuits of FIGS. 4 and 5, in accordance with one or more embodiments of the present invention. In the following, for the sake of convenience, the nomenclature of the "add_out" signal names has been simplified to "add_out_" followed by the suitable numeral.

In one or more embodiments, signals add_out_0, add_out_1, add_out_2, add_out_3, correspond to the output values of latches 440-L0, 440-L1, 440-L2, and 440-L3, respectively. At the left of the chart 600, the four signals are initialized to 0 in a step-wise manner. The signals remain at 0 until the test enable signal "test_en" is activated. Thereafter, the four signals begin changing in accordance with the above-described operation of the scan chain 440 output of circuit 400. More specifically, the binary word formed by the four signals, when suitably ordered according to their respective bit-order ranks, begins incrementing from 0000, to 00001, all the way up to 1111. Thereafter, shortly after the "5 ns" (5 nanosecond) point shown along the top of chart 600, the values of all four outputs drop to 0 again, as expected.

Figure 7:
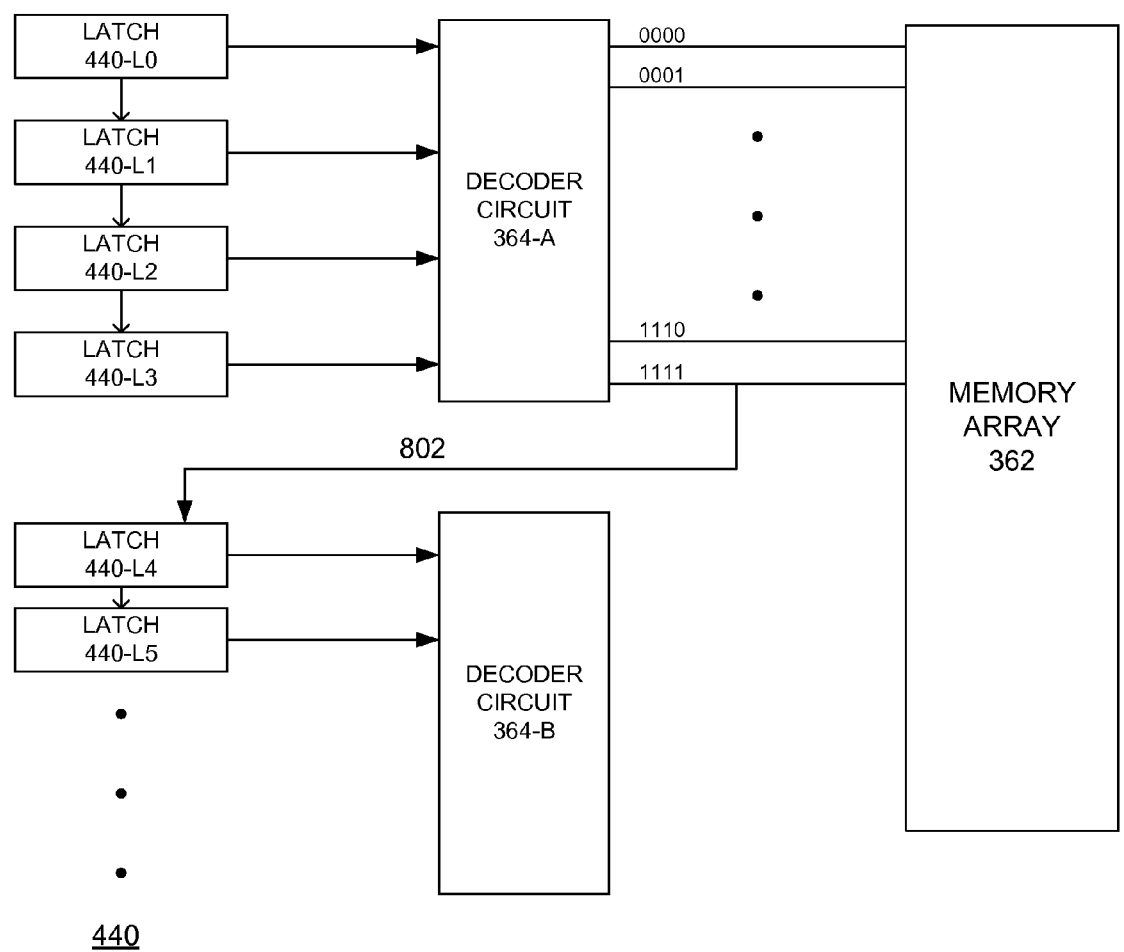
FIG. 7 is a block diagram of a circuit for expediting the provision of a carry signal to a data latch, in accordance with one or more embodiments of the present invention.
Figure 8:
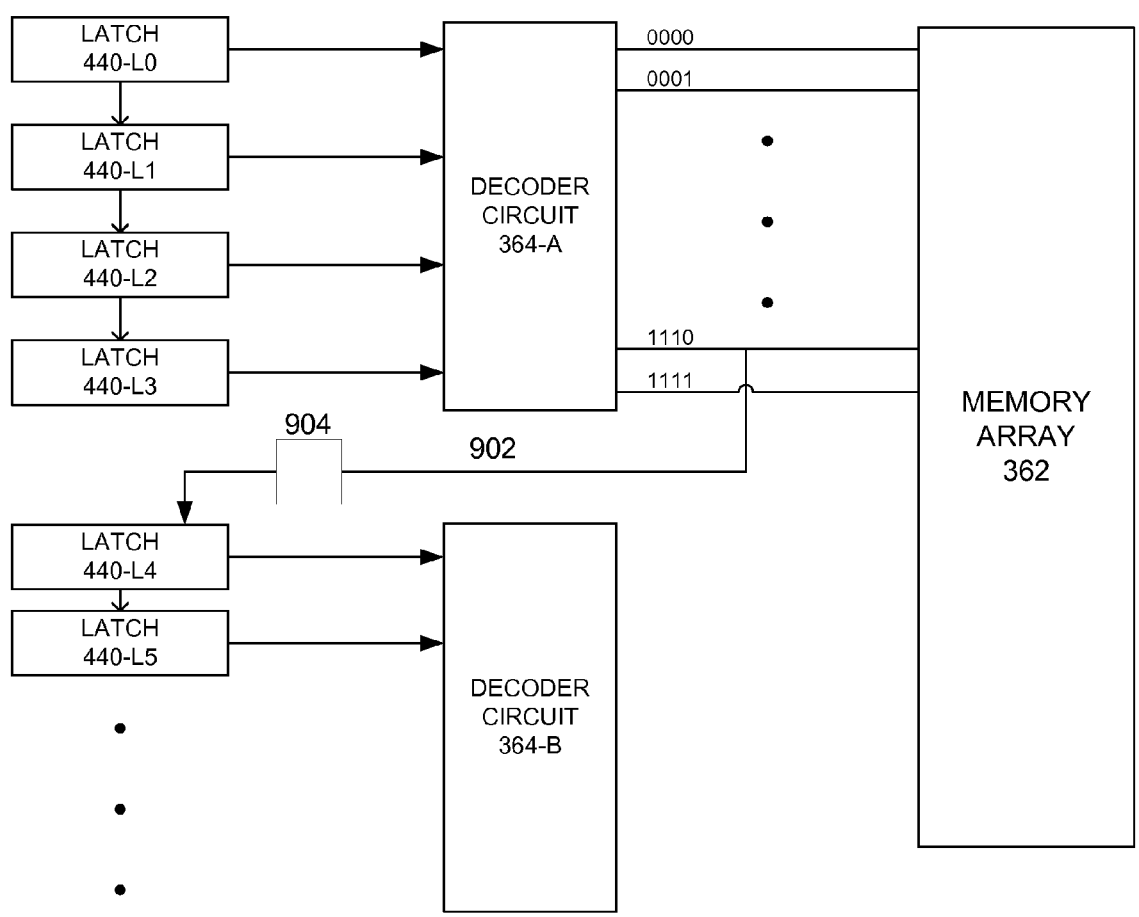
FIG. 8 is a block diagram of a circuit for expediting the provision of a carry signal to a data latch, in accordance with one or more alternative embodiments of the present invention.

FIG. 7 is a block diagram of a circuit 800 for expediting the provision of a carry signal to a data latch, in accordance with one or more embodiments of the present invention. FIG. 8 is a block diagram of an alternative embodiment of circuit 800 of FIG. 7. FIGS. 7 and 8 each illustrate at least a portion of one or more embodiments of array macro 350. However, for the sake of simplicity, the block marking the boundaries of array macro 350 has been omitted in FIGS. 7 and 8. Circuits 800 and 900 may include various components in common with the embodiment of FIG. 3. Accordingly, the descriptions of components discussed in connection with FIG. 3 are not repeated in this section.

In one or more embodiments, circuit 800 may be operable to expedite the propagation of a carry signal to a selected data latch to ensure the timely updating of the carry-signal input to the selected latch. Expediting the propagation of the bypass signal in this manner may operate to bypass the delays incurred in propagating the carry signal through a sequence of lower-bit-order data latches. Circuit 900 of FIG. 8 provides an alternative approach to expediting the propagation of a carry signal, as described in detail below.

While the following description is directed to embodiments in which a bypass circuit is connected between either output pin 1110 or 1111 of decoder circuit 364-A and data latch 440-L4 of scan chain 440, it will be appreciated by those of ordinary skill in the art that a bypass circuit may be disposed between any starting point and any end point within either of circuits 700 or 800 for which the bypass circuit may beneficially expedite the propagation of a carry signal, or other signal, to aid the proper operation of the pertinent circuit.

In one or more embodiments, circuit 800 may include scan chain 440, decoder circuit 364-A, decoder circuit 364-B, and memory array 362. Circuit 800 adds decoder circuit 364-B, a plurality of latches connected thereto, and bypass circuit 802 to the components discussed in connection with FIG. 3. Accordingly, the following discussion is first directed to these added components.

In one or more embodiments, decoder circuit 364-B is an additional instance of decoder circuit 364-A and may provide the same function described in connection with decoder circuit 364-B. Similarly, the latches 440-L4, 440-L5 etc . . . , which may be connected to decoder circuit 364-B, may perform the same function described in connection with latches 440-L1 through 440-L4 of FIG. 3. Accordingly, a detailed discussion of these components is not provided herein.

Bypass circuit 802 may be a signal path that may extend from an output pin of decoder circuit 364-A to an input, which may be the "carry signal" input, of a selected data latch of scan chain 440. In the embodiment of FIGS. 7 and 8, the selected data latch may be data latch 440-L4 which may be connected to decoder circuit 364-B.

The discussion of FIG. 3 described the incrementing of the binary word output of scan chain 440 being operable to increment from "0000" through "1111". However, incrementing the binary word beyond the value 1111 may confront a signal propagation timing problem as described in the following. In one or more embodiments, the incrementing of the value "1111" may begin by conducting a logical operation at latch 440-L0. The result of adding "1" to the existing latch output value of "1" may produce a carry signal value of 1 which, as discussed in connection with FIG. 3, may be input to the next higher-ordered latch, which is latch 440-L2. At latch 440-L2, an addition of two "1" values may also occur, which may again generate a carry signal value of "1" for input to latch 440-L3. This process may continue until the scan chain 440 output value "10000" is reached, for which output value, data latch 440-L4 has an output of 1.

The above-described sequence of operations may produce a succession of logical operations that may propagate the carry signal from latch 440-L0 to latch 440-L4. While the carry signal may eventually reach latch 440-L and eventually provide a correct value at the suitable input and output thereof, the delay imposed by the described signal propagation delay may cause the output of latch 440-L4 to have an outdated value when a clock pulse is activated that is intended to write data to an updated address value. Accordingly, a "look-ahead carry" may be implemented to address this matter.

In one or more embodiments, bypass circuit 802 may be deployed to provide a look-ahead carry to expedite the propagation of a carry signal to a data latch that may otherwise experience a delayed arrival of a carry signal. Bypass circuit 802 may be connected between a selected one of the output pins of decoder circuit 364-A and a selected data latch of scan chain 440. More specifically, in the embodiment of FIG. 7, bypass circuit 802 may be connected between the output pin of decoder circuit 364-A, corresponding to memory address "1111", and data latch 440-L4 of scan chain 440.

In one or more embodiments, with the above-described bypass circuit 802 connection in place, the scan chain 440 binary word output may increment as described previously in connection with FIG. 3 for scan chain output values between "0000" and "1110". However, when this binary word output increases from 1110 to 1111, the activation of the 1111 output pin of decoder circuit 364-A may rapidly transmit a logical value of "1" to the carry signal input of latch 440-L4. In this manner, the delay associated with propagating a carry signal through the lower-bit-order latches (latches 440-L0 through 440-L3) of scan chain 440 is avoided along with the timing problems that may be caused thereby.

Turning to FIG. 8, in one or more alternative embodiments, bypass circuit 902 may be connected between the decoder circuit 364-A output pin corresponding to memory location 1110, the output pin adjacent to the highest-address-value output pin of decoder circuit 364-A, and data latch 440-L4. Bypass circuit 902 may include data latch 904. This alternative to bypass circuit 802 may be employed where the signal path length of bypass circuit 802 is sufficiently long that the carry signal needed at latch 404-L4 may arrive late even with the deployment of bypass circuit 802 as shown in FIG. 7.

In one or more embodiments, bypass circuit 902 may begin carrying a carry signal toward the carry signal input of latch 440-L4 when output pin 1110 of decoder circuit 364-A is activated, thereby initiating the propagation of the carry signal along bypass circuit 902 at an earlier point in time than is done in circuit 800 of FIG. 7, which may enable the carry signal to reach latch 440-L4 in time to generate a correct output at latch 440-L4.

In one or more embodiments, data latch 904 may be deployed to enable more accurate control of the timing of the arrival of the carry signal at latch 440-L4. In the event that an uninterrupted transmission of the carry signal along bypass circuit 902 may reach data latch 440-L4 too early, the propagation of the carry signal may effectively be temporarily suspended at data latch 904, and may be subsequently transmitted to data latch 440-L4 upon receipt of a suitably timed clock signal at data latch 904.

Figure 9:
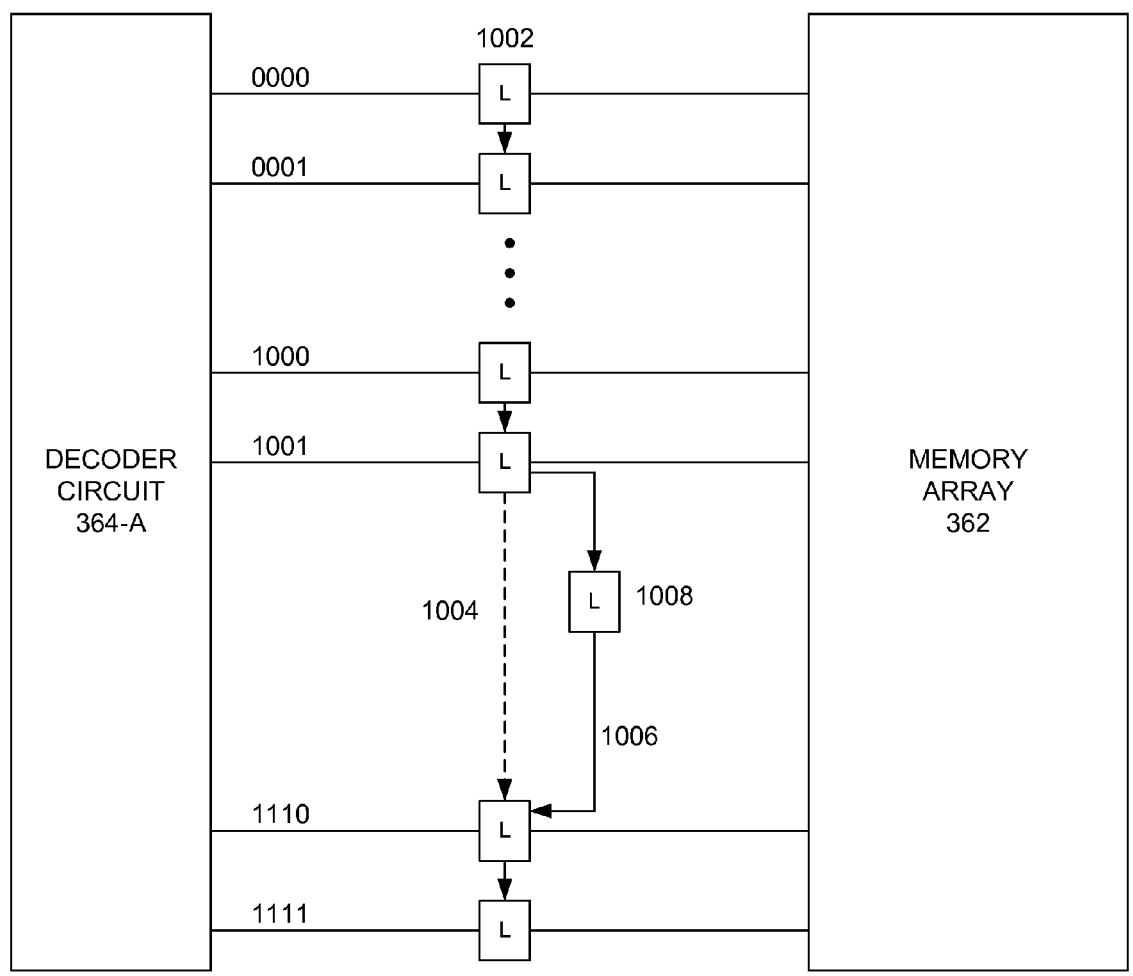
FIG. 9 is a block diagram of a circuit for shifting a signal through a succession of signal paths in accordance with one or more of the embodiments of the present invention.

FIG. 9 is a block diagram of a circuit 1000 for shifting a signal through a succession of signal paths in accordance with one or more embodiments of the present invention. In one or more embodiments, circuit 1000 may form part of an array macro, such as array macro 120 of FIG. 1. However, the present invention is not limited to such embodiments.

In one or more embodiments, circuit 1000 may include decoder circuit 364-A, a plurality of output pins extending therefrom, shift circuit 1002, and memory array 362. Decoder circuit 364-A and memory array 362 have previously been described herein, and those descriptions are therefore not repeated in this section. In one or more embodiments, shift circuit 1002 may include a plurality of data latches that are serially connected to form a scan chain and bypass circuit 1006, which may in turn include data latch 1008.

In one or more embodiments, circuit 1000 may be operable to shift an active signal through a succession of memory location selection signal paths leading to memory array 362. More specifically, circuit 1000 may be operable to increment the address value of a memory location in memory array 362 accessed by circuit 1000 once for each cycle of a clock signal input thereto.

As with the embodiments discussed in connection with FIGS. 3-8, the shift-counter based approach to automatically incrementing the address memory location, discussed below in connection with FIG. 9, may be coordinated with the operation of a write circuit that may act upon "write" control signals to write data to the memory array 362 locations indicated by shift counter 1002 of circuit 1000.

In one or more embodiments, the connections between the respective data latches forming shift circuit 1002 may be substantially permanently established within circuit 1000. However, in one or more alternative embodiments, the links forming a scan chain out of the latches of shift circuit 1002 may be controllably implemented and disabled employing selector circuits and suitably control signal(s).

In the following, for the sake of convenience, output pins extending from decoder circuit 364-A are identified using the memory address values they are associated with. In one or more embodiments, an initial value of "1", or logical high value, may be scanned into the latch for output pin 0000. Thereafter, the application of suitably timed clock signals may operate to transfer this logic-1 value through a sequence of progressively higher-address-value output pins and associated latches, in each case restoring the latch the signal is leaving to a logic-0 value. Thus, among the first four output pins, the output pin values would have the values shown below as a function of time. (The values of only four pins are presented below for the sake of brevity). In the following, "time" may be a measure of a number of elapsed clock pulses.

| Time: | Signal values of first four output pins. |
|---|---|
| 1 | 0001 |
| 2 | 0010 |
| 3 | 0100 |
| 4 | 1000 |

In one or more embodiments, the shifting of the active signal may proceed from the 0000 output pin to the 1111 output pin in the manner shown above.

In one or more embodiments, it may be desirable to skip one or more memory locations in memory array 362. To accomplish this, one or more output pins at the output of decoder circuit 364-A may be skipped using bypass circuit 1006. Bypass circuit 1006 of FIG. 9 is shown extending between output pin 1001 and output pin 1110. However, it will be appreciated that bypass circuit 1006 could be deployed between any two output pins extending from decoder circuit 364-A.

In one or more embodiments, enabling the shifting of the active signal along bypass circuit 1006 instead of along normal path 1004 may be enabled using selectors and suitable control signal(s). However, in one or more alternative embodiments, bypass circuit may be permanently hard-wired into circuit 1000.

When bypass circuit 1006 is enabled, the active signal may be transferred along bypass circuit 1006 instead of normal path 1004. The active signal may reach data latch 1008 where it may pause until a suitable clock signal is received. Upon receipt of the clock signal, the active signal may propagate along the remainder of bypass circuit 1006 to pin 1110. Thereafter, the active signal may propagate normally to output pin 1111.

FIG. 10 is a flow diagram illustrating process steps that may be carried out in accordance with one of more of the embodiments disclosed and/or discussed herein. By way of example, methods and/or apparatus may provide for establishing a stored test vector, including a plurality of data bits, within a vector data engine (step 1100). Next, the stored test vector may be transmitted to a memory array (step 1102). Next, at least one arithmetic or logical operation may be performed upon the stored test vector (step 1104). By way of example, the at least one arithmetic or logical operation may be performed by a vector data generator within the vector data engine to update the stored test vector. The steps of transmitting 1102 and performing 1104 may be repeated at decision step 1106 so as to continuously transmit continuously changing stored test vectors to the memory array. The steps of repeating the transmitting and performing steps may be conducted automatically upon receiving at least one clock pulse.

It is noted that the methods and apparatus described thus far and/or described later in this document may be achieved utilizing any of the known technologies, such as standard digital circuitry, analog circuitry, any of the known processors that are operable to execute software and/or firmware programs, programmable digital devices or systems, programmable array logic devices, or any combination of the above. One or more embodiments of the invention may also be embodied in a software program for storage in a suitable storage medium and execution by a processing unit.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method, comprising:
   establishing a stored test vector, including a plurality of data bits, within a vector data engine;
   transmitting the stored test vector to a memory array;
   performing at least one arithmetic or logical operation upon the stored test vector by a vector data generator within the vector data engine to update the stored test vector; and
   repeating the steps of transmitting and performing so as to continuously transmit continuously changing stored test vectors to the memory array.

2. The method of claim 1 wherein the repeating step comprises:
   automatically repeating the transmitting and performing steps upon receiving at least one clock pulse.

3. The method of claim 1 wherein the repeating step comprises:
   repeating the steps of transmitting and performing at a sufficiently high frequency to dynamically test the memory array.

4. The method of claim 1 wherein the step of transmitting comprises:
   transmitting the plurality of data bits along a plurality of respective parallel paths extending from the vector data engine.

5. The method of claim 1 wherein the stored test vector is an address vector.

6. The method of claim 1 wherein the establishing step comprises:
   scanning a plurality of bits into the vector data engine.

7. The method of claim 1 wherein the establishing step comprises:
   transmitting a reset signal to the vector data engine.

8. The method of claim 1 wherein the transmitting step comprises transmitting the stored test vector to the memory array via one of:
   a) a row decoder circuit; and
   b) a column decoder circuit.

9. The method of claim 1 wherein the performing step comprises one of:
   incrementing the stored test vector; and
   decrementing the stored test vector.

10. The method of claim 9 wherein incrementing step comprises:
    incrementing by one; and wherein the decrementing step comprises:
    decrementing by one.

11. The method of claim 1 wherein the performing step comprises:
    operating upon the stored test vector with at least one adder circuit.

12. The method of claim 1 wherein the step of continuously transmitting comprises:
    transmitting stored test vector data to the memory array once for every cycle of a data transmission clock.

13. The method of claim 1 wherein the performing step is performed once for each cycle of a vector data calculation clock.

14. An apparatus for providing data to memory array, the apparatus comprising a vector data engine having a data storage device and a vector data generator, the vector data engine operates to:
    establish a stored test vector, including a plurality of data bits, within the data storage device;
    transmit the stored test vector to the memory array;
    perform at least one arithmetic or logical operation upon the stored test vector by the vector data generator to update the stored test vector; and
    continue to transmit and update the stored test vector.

15. The apparatus of claim 14 wherein the vector data engine operates to:
    automatically continue to transmit and update the stored test vector upon receipt of at least one clock pulse.

16. The apparatus of claim 14 wherein the vector data engine operates to:
    continue to transmit and update the stored test vector at a sufficiently high frequency to dynamically test the memory array.

17. The apparatus of claim 14 wherein vector data engine operates to:
    transmit the plurality of data bits along a plurality of respective parallel paths extending from the vector data engine.

18. The apparatus of claim 14 wherein the stored test vector is an address vector.

19. The apparatus of claim 14 wherein the vector data engine operates to:
    scan a plurality of bits into the vector data engine.

20. The apparatus of claim 14 wherein the vector data engine operates to:
    transmit a reset signal to the vector data engine.

21. The apparatus of claim 14 wherein the stored test vector is transmitted to the memory array via one of:
    a) a row decoder circuit; and
    b) a column decoder circuit.

22. The apparatus of claim 14 wherein the vector data engine operates to do one of:
    increment the stored test vector; and
    decrement the stored test vector.

23. The apparatus of claim 22 wherein the vector data engine operates to do one of:
    increment by one; and decrement by one.

24. The apparatus of claim 14 wherein the vector data generator comprises at least one adder circuit.

25. The apparatus of claim 14 wherein the vector data engine operates to:
    transmit vector data to the memory array once for each cycle of a data transmission clock.

26. The apparatus of claim 14 wherein the vector data engine operates to
    perform the at least one arithmetic or logical operation once for each cycle of a vector data calculation clock.

27. The apparatus of claim 14 wherein the data storage device comprises:
    a plurality of data latches connected in series to form a scan chain.

28. The apparatus of claim 27 wherein the vector data generator comprises:
a plurality of adder circuits incorporated into the plurality of respective data latches.

29. The apparatus of claim 28 wherein at least one of the plurality of adder circuits is a half-adder circuit.

30. The apparatus of claim 28 further comprising:
a first decoder circuit in communication with a first set of the data latches and the memory array, the decoder circuit including a plurality of output pins extending therefrom; and
a bypass circuit connected between a selected one of the output pins and a selected one of the data latches, wherein the bypass circuit operates to transmit a look-ahead carry signal to the selected data latch when the selected output pin is activated.

31. The apparatus of claim 30 further comprising:
a second decoder circuit in communication with a second set of the data latches, wherein the bypass circuit is connected between a highest-address-value output pin of the first decoder circuit and a lowest-bit-order data latch of the second set of data latches.

32. The apparatus of claim 30 wherein the bypass circuit comprises at least one data latch, wherein the data latch operates to delay the transmission of the look-ahead carry signal through the bypass circuit.

33. The apparatus of claim 32 further comprising:
a second decoder circuit in communication with a second set of the data latches, wherein the bypass circuit is connected between an output pin adjacent to the highest-address-value output pin of the first decoder circuit and a lowest-bit-order data latch of the second set of data latches.

34. The apparatus of claim 14 wherein the vector data generator comprises:
at least one adder circuit in communication with the data storage device.

* * * * *